US009503068B1

United States Patent
DiBene, II et al.

(10) Patent No.: US 9,503,068 B1
(45) Date of Patent: Nov. 22, 2016

(54) SUPPLY VOLTAGE ENVELOPE DETECTION

(71) Applicant: Apple Inc., Cupertino, CA (US)

(72) Inventors: Joseph T. DiBene, II, Santa Cruz, CA (US); Sanjay Pant, Santa Clara, CA (US); Sotirios Zogopoulos, Los Altos, CA (US); Jafar Savoj, Sunnyvale, CA (US); Inder M. Sodhi, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/068,003

(22) Filed: Mar. 11, 2016

(51) Int. Cl.
| H03D 1/00 | (2006.01) |
| H03K 5/00 | (2006.01) |
| H03K 5/159 | (2006.01) |
| H03L 7/06 | (2006.01) |
| G01R 19/04 | (2006.01) |

(52) U.S. Cl.
CPC .............. H03K 5/159 (2013.01); G01R 19/04 (2013.01); H03L 7/06 (2013.01)

(58) Field of Classification Search
USPC ....................... 327/50, 54, 56, 170
See application file for complete search history.

(56) References Cited

U.S. PATENT DOCUMENTS

| 7,528,619 | B2 | 5/2009 | Paillet et al. | |
| 8,497,694 | B2 | 7/2013 | Chua-Eoan et al. | |
| 8,648,645 | B2 | 2/2014 | Konstadinidis et al. | |
| 8,847,777 | B2 | 9/2014 | Ramaswami | |
| 2002/0012405 | A1* | 1/2002 | Lee | G11C 16/26 375/300 |
| 2004/0105516 | A1* | 6/2004 | Smith | H03L 7/07 375/354 |
| 2005/0007154 | A1* | 1/2005 | Patella | G01R 31/3016 327/2 |
| 2014/0040692 | A1* | 2/2014 | Shah | G06F 11/24 714/736 |

\* cited by examiner

*Primary Examiner* — Adam Houston
(74) *Attorney, Agent, or Firm* — Meyertons, Hood, Kivlin, Kowert & Goetzel, P.C.; Lawrence J. Merkel

(57) ABSTRACT

In an embodiment, a supply voltage envelope detector circuit is configured to detect a shape of the supply voltage over time and to compare the detected shape to expected shapes that indicate voltage droop events for which corrective action may be needed. The expected shapes may be predetermined based on one or more of: the design of the integrated circuit that includes the supply voltage envelope detector circuit; attributes of the power management unit (PMU) that is to generate the supply voltage for the integrated circuit; and/or attributes of the system that includes the integrated circuit. The shape of the voltage droop may experience little variation during use, and thus may be used to detect a droop event earlier and more accurately than a threshold-based mechanism, in some embodiments.

20 Claims, 4 Drawing Sheets

SUPPLY VOLTAGE ENVELOPE DETECTION

BACKGROUND

Technical Field

Embodiments described herein are related to supply voltage droop detection and, more particularly, to detecting an envelope of the supply voltage magnitude over time.

Description of the Related Art

Integrated circuits present a load to the power management units that generate the supply voltages for the integrated circuits. The power management units have maximum currents that they can source while still keeping a relatively steady voltage supplied to the integrated circuit. In some cases, the integrated circuit can attempt to draw more current than the power management unit can supply, which leads to droop in the power supply voltage. Similarly, instantaneous changes in demand can occur faster than the power management unit can react to the changes, causing transient droops in the power supply voltage. If the droop is too large in magnitude, the integrated circuit may experience erroneous operation. The power supply voltage is also referred to more succinctly herein as the "supply voltage."

Generally, systems including integrated circuits have monitored the supply voltage magnitude for dropping below a particular threshold level, and attempt to throttle the integrated circuit or take other corrective action to prevent error when the drop is detected. If the threshold is set too close to the actual supply voltage magnitude, the corrective action can be triggered too frequently and performance can suffer. If the threshold is set too far from the actual supply voltage magnitude, the corrective action often must be severe to ensure that error does not occur.

SUMMARY

In an embodiment, a supply voltage envelope detector circuit is configured to detect a shape, or envelope, of the supply voltage magnitude over time. Expected shapes that indicate voltage droop events for which corrective action may be needed may be compared to the detected shape. The expected shapes may be predetermined based on one or more of: the design of the integrated circuit that includes the supply voltage envelope detector circuit; attributes of the power management unit (PMU) that is to generate the supply voltage for the integrated circuit; and/or attributes of the system that includes the integrated circuit. The shape of the voltage droop may experience little variation during use, and thus may be used to detect a droop event earlier and more accurately than a threshold-based mechanism, in some embodiments. In some embodiments, less drastic corrective actions may be taken (e.g. actions that impact performance less, or actions that consume less power) since the droop events may be detected earlier in time. In some embodiments, the extent of the voltage droop event and the corrective action to be taken may be predicted based on the observed shape.

In an embodiment, the supply voltage envelope detector circuit may detect the shape of the droop, e.g. in terms of relative variation from the desired supply voltage magnitude. Thus, the same detector may be used at various desired supply voltage magnitudes without modification. Threshold-based mechanisms must typically be reprogrammed for different thresholds as the desire supply voltage magnitude is dynamically changed during use.

BRIEF DESCRIPTION OF THE DRAWINGS

The following detailed description makes reference to the accompanying drawings, which are now briefly described.

Figure 1:
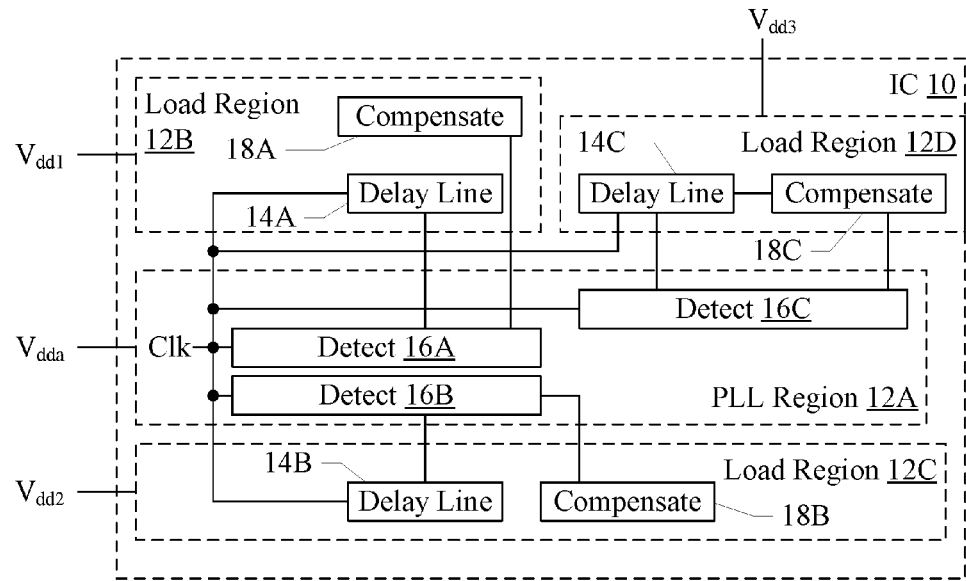
FIG. 1 is a block diagram of an integrated circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

Turning now to FIG. 1, a block diagram of one embodiment of an integrated circuit (IC) 10 is shown. In the illustrated embodiment, the IC 10 includes various regions 12A-12D. Each region 12A-12D has a separate supply voltage input to the IC 10, on which the supply voltage for circuitry in that region is received during use. Alternatively, one or more regions 12B-12D may share a supply voltage input but may be power-gated independently. The power supply input for each region may, e.g., be multiple pins to the IC 10 based on the amount of current the corresponding power supply input is expected to source during use. Alternatively, the IC 10 may receive one or more supply voltage inputs (e.g. a supply voltage $V_{dda}$ for the PLL region 12A and a $V_{dd}$ voltage for other regions 12B-12D) and on-chip voltage regulation may be used to produce the supply voltages for different regions 12B-12D. As illustrated in FIG. 1, the phase-locked loop (PLL) region 12A receives a supply voltage $V_{dda}$; the load region 12B receives a supply voltage $V_{dd1}$; the load region 12C receives a supply voltage $V_{dd2}$; and the load region 12D receives a supply voltage $V_{dd3}$. The number of regions may vary from embodiment to embodiment, including more or fewer regions than those shown in FIG. 1. The PLL region 12A includes instances of a detect circuit 16A-16C, one for each load region 12B-12D. The detect circuits are coupled to a clock input (Clk in FIG. 1). The load regions 12B-12D each include an instance of a delay line circuit 14A-14C and a compensate circuit 18A-18C as shown in FIG. 1. In other embodiments, one or more load regions 12A-12D may share a compensate circuit. The detect circuits 16A-16C are coupled to multiple taps from the respective delay line circuits 14A-14C. The delay line circuits 14A-14C are coupled to the clock input as well. The detect circuits 16A-16C are also coupled to the respective compensate circuits 18A-18C.

The PLL region 12A may include one or more PLLs and/or other clock generation circuitry configured to generate the clocks for use in the IC 10. More generally, the PLL region 12A may include the analog circuitry in the IC 10. The supply voltage for the region 12A, $V_{dda}$, may have higher signal-to-noise ratio requirements than the other supply voltages to the IC 10 (e.g. $V_{dd1}$ to $V_{dd3}$). That is, analog circuitry may require a "quieter" supply voltage to operate properly than the digital circuitry in other regions 12B-12D may require. Viewed in another way, the supply voltage $V_{dda}$ may be more stable, or relatively unchanging, as compared to $V_{dd1}$ to $V_{dd3}$ during operation. As a result, operation of the detect circuits 16A-16C may be relatively constant during operation, even in the presence of noise on the supply voltages $V_{dd1}$ to $V_{dd3}$. The load regions 12B-12D may include digital circuitry in the IC 10, in an embodiment.

A delay line circuit may generally include multiple delay stages in series. The delay stages may each have a specified delay in time from an input propagating to the output. The delay may vary based on the supply voltage magnitude, temperature, manufacturing variations, etc. In some embodiments, the delays of each stage may be equal (nominally, although some variation in delay between stages may occur due to manufacturing variations and operating condition variations may occur). In other embodiments, different delay stages may have different delays. In an embodiment, the delay stages may be buffer circuits that produce the same transition on the output as occurs on the input. In another embodiment, the delay stages may be inverter circuits and each delay stage may also produce an inversion. Accordingly, since the delay line circuits 14A-14C are located in the load regions 12B-12D that are subject to supply voltage variation, the delays in the delay line circuits 14A-14C may vary with the supply voltage variation. Since the detect circuits 16A-16C are in the relatively quiet PLL region 12A, the detect circuits 16A-16C may detect the variations in delay with a high degree of accuracy.

At various points along the series of delay stages, taps may be connected to provide outputs. Each tap may thus have a different delay from the input to the delay line circuit. These taps may be observed by the respective detect circuits 16A-16C. For example, the taps may be sampled at a particular point in time, or otherwise may be observed to directly or indirectly detect delay. In the absence of supply voltage droop and other noise on the supply voltages $V_{dd1}$ to $V_{dd3}$, the observations from the detect circuits 16A-16C would be the same from sample to sample. However, when supply voltage droops occur, the operation of the delays in the delay line circuits 14A-14C may change, which may result in differences in the observations. For a given shape of the supply voltage droop, the changes in the observations may be predictable. Since droop events which need corrective action also have a regular, predictable shape, the detect circuits 16A-16C may be provided with predetermined patterns to compare to the observations, to detect the droop events. In response to detecting a droop event, the detect circuits 16A-16C may signal the corresponding compensate circuits 18A-18C, which may implement the corrective actions. In some embodiments, the predetermined patterns may predict further voltage droop that may be about to occur, permitting earlier corrective action than might otherwise be possible in a non-predictive scheme. Less drastic corrective actions may be implemented, which may be more efficient and/or save power compared to more drastic corrective actions.

Any set of corrective actions may be used in various embodiments. For example, the compensate circuits 18A-18C may be configured to throttle operation of other circuits within the load region 12B-12D (other circuits not shown in FIG. 1). Throttling may refer to reducing the operation of the circuits through logical controls (e.g. by stalling pipelines, temporarily disabling some circuitry, etc). Other corrective actions may include reducing the clock frequency of clocks controlling the other circuitry in the load region 12B-12D. The frequency may be reduced through clock gating, pulse swallowing, modification of parameters in the clock generation circuitry such as the PLL, etc. Corrective actions may include increase the magnitude of the supply voltage, or causing the PMU to increase the amount of charge being supplied on the corresponding power supply input, to decrease the amount of voltage droop that occurs during the voltage droop event.

The supply voltage $V_{dda}$ may be uncorrelated to the supply voltages $V_{dd1}$ to $V_{dd3}$. That is, the sources of the voltages within the PMU may be sufficiently isolated from each other that noise, such as voltage droop events, on one voltage has no appreciable effect on the other voltage. The voltages may be sourced from separate voltage regulators, for example. Filtering may be provided between the uncorrelated voltages. Any mechanism for providing isolation and ensuring that the lack of correlation between the supply voltage $V_{dda}$ and the other supply voltages $V_{dd1}$ to $V_{dd3}$ may be used.

As mentioned above, the detection of the supply voltage envelope described herein may be independent of the absolute value of the supply voltage magnitude, in an embodiment. The supply voltage magnitude may be changed dynamically during use, and may affect both the speed of the delay line circuits 14A-14C and the detect circuits 16A-16C in a similar fashion. The relative difference during droop events may have an effect on the observed values and thus may be detected in the detect circuits 16A-16C. On the other hand, a threshold voltage may have to be set based on the supply voltage magnitude, and thus would be changed with each dynamic voltage change.

Figure 2:
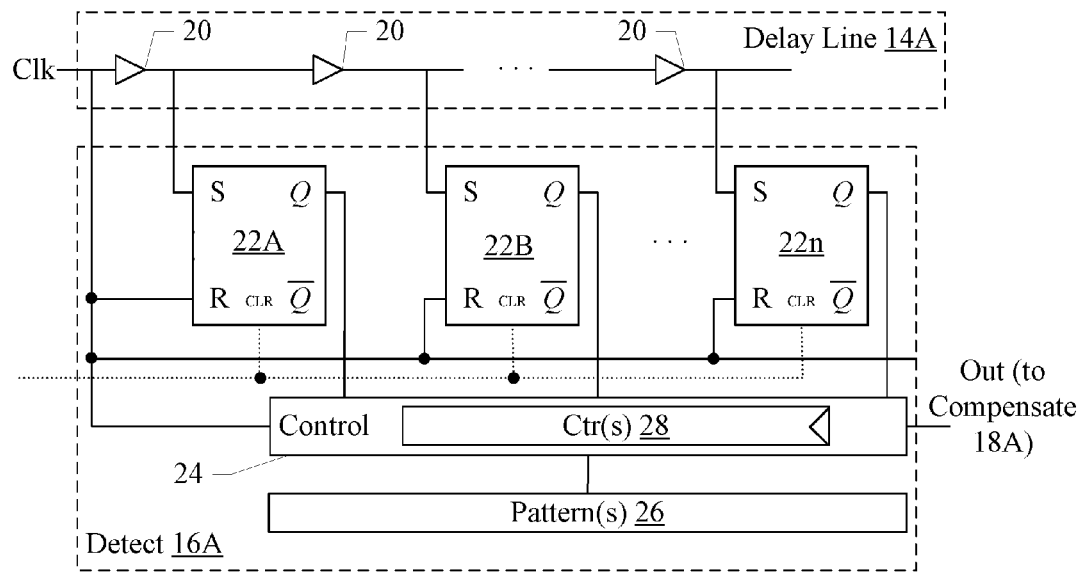
FIG. 2 is a block diagram of one embodiment of an envelope detector.

FIG. 2 is a block diagram illustrating one embodiment of the delay line circuit 14A and the detect circuit 16A in greater detail. Other delay line circuits 14B-14C and detect circuits 16B-16C may be similar. In the embodiment of FIG. 2, the delay line circuit 14A includes multiple buffer circuits 20, with taps between the buffer circuits 20. Each tap is coupled to the set (S) input of a respective set-reset (SR) flop 22A-22n in the detect circuit 16A. The clock Clk that is input to the delay line circuit 14A is also coupled to the reset (R) input of the SR flops 22A-22n. In some embodiments, the SR flops 22A-22n do not include a clear (CLR) input. In other embodiments, the SR flops 22A-22n include the CLR input and it is optionally coupled to a clear input signal (dotted line in FIG. 2) that may be used to clear the SR flops 22A-22n. The outputs of the SR flops 22A-22n are coupled to a control circuit 24, which is further coupled to one or more patterns 26 and to the input clock Clk.

The total delay of the buffers 20 forming the delay line circuit 14A may be any desired length. For example, the total delay may be approximately the length of one clock cycle of the input clock Clk. Alternatively, the total delay may be multiple clock cycles of the input clock Clk, or any other desired length.

In one embodiment, a pulse may be launched on the input clock Clk into the delay line circuit 14A and to the R inputs of the SR flops 22A-22n. That is, the input clock Clk may not be a free-running clock, but rather may be gated and a pulse launched periodically to detect voltage droop events. In other embodiments, the input clock Clk may be a free-running clock and the detect circuit 16A may detect continuously. Additionally, the input clock Clk may be pulsed for multiple consecutive clock cycles to detect multi-cycle patterns.

The pulse on the input clock Clk (i.e. a rising edge followed by a falling edge) may travel down the delay line circuit 14A, and may propagate to the set input of the flops 22A-22n over time. The pulse (without significant delay) may be propagated to the R input. When both the S and R inputs are high concurrently, the output of the flops may be either a binary one or a binary zero, depending on the design of the flops. A "set dominant" flop may output a binary one, while a "reset dominant" flop may output a binary zero. However, since the taps on the delay line circuit 14A convey delayed versions of the pulse, the S inputs may generally be asserted subsequent to deassertion of the R inputs. Thus, the resulting output of the SR flops 22A-22n may be binary ones. Some of the S inputs may not overlap at all with the assertion of the R inputs, however. That is, the delay to the corresponding tap in the delay line circuitry may be longer than the length of the pulse on the input clock Clk. In one embodiment, the control circuit 24 may be configured to observe the outputs of the SR flops 22A-22n at the falling edge of the input clock Clk. Thus, the flops 22A-22n which have at least some overlap between the pulse on the corresponding tap from the delay line circuit 14A and the input clock Clk pulse should be observed as binary ones and the remaining flops 22A-22n should be observed as binary zeros.

If a voltage droop event starts or is in progress over the clock cycle of the input clock Clk, the pattern of binary ones and zeros observed by the control circuit 24 may change. As mentioned previously, the supply voltage $V_{dda}$ to the detect circuit 16A may be relatively stable. However, if a voltage droop event is occurring on the supply voltage $V_{dd1}$, the operation of the delay line circuit 14A may slow down relative to the detect circuit 16A. Thus, some flop outputs that should be binary zero may become binary one, or vice-versa.

Because the shape, or envelope, of the voltage droop events are somewhat predictable, the expected pattern of SR flop outputs when the voltage droop events are occurring may be predicted. The patterns that indicate voltage droop events may be provided as the patterns 26, and the control circuit 24 may be configured to compare the patterns to the observed pattern. If there is a match, the control circuit 24 may be configured to assert an output to the compensate circuit 18A to compensate for the detected voltage droop event.

In an embodiment, detecting one pattern may be sufficient to detect a voltage droop event. In another embodiment, a series of patterns may be detected over a set of consecutive clock cycles of the input clock Clk to detect the voltage event. One or more counters 28 may be included to count matched patterns and/or to track states of a sequential state machine such as the one shown in FIG. 6, for example.

The patterns 26 may be provided in any fashion. For example, the patterns 26 may be a set of fuses and the predetermined patterns may be fused into the integrated circuit 10 at manufacture. Alternatively, the patterns 26 may include one or more registers programmable with the predetermined patterns. The predetermined patterns may be determined in any fashion. For example, simulation of the delay line circuits 14A-14C and the detect circuits 16A-16C during the droop events may be performed during design of the IC 10 and the results may be recorded for fusing/programming the patterns 26 in the IC 10. Alternatively, the circuits 14A-14C and 16A-16C may be tested at manufacture and the results may be recorded/included in the IC 10 (e.g. by fusing/programming the patterns 26)

The control circuit 24 may be configured to observe the outputs of the flops 22A-22n in any desired fashion. For example, the control circuit 24 may include one or more registers, flops, latches, or other clocked storage devices configured to sample the outputs of the flops 22A-22n at the falling edge of the input clock Clk. The number of binary ones may be counted at the falling edge, or any other mechanism for detecting the pattern at the falling edge may be used.

Figure 3:
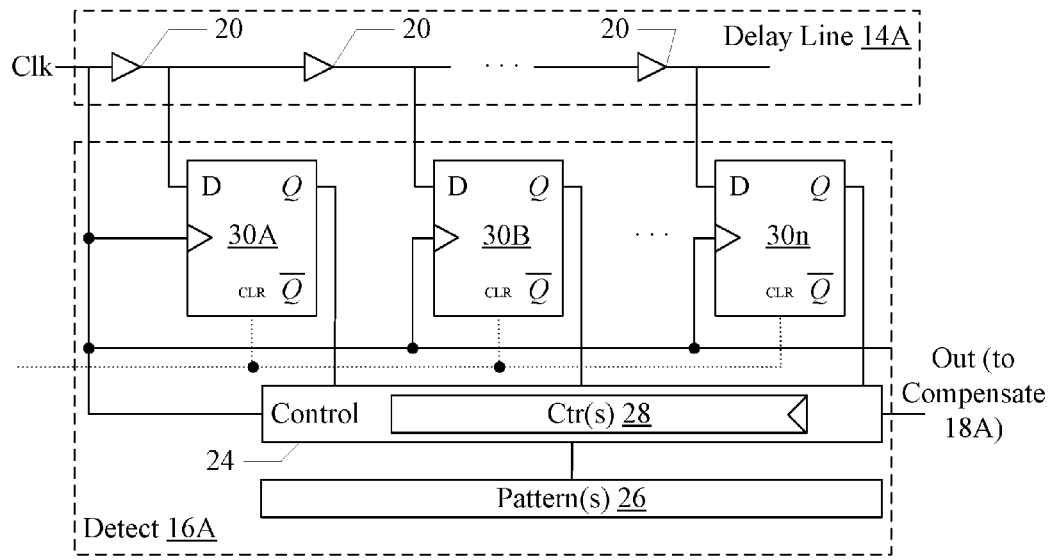
FIG. 3 is a block diagram of another embodiment of the envelope detector.

Other embodiments of the detect circuit 16A are possible as well. For example, an embodiment of the detect circuit 16A that uses data (D) flops 30A-30n is shown in FIG. 3.

Figure 4:
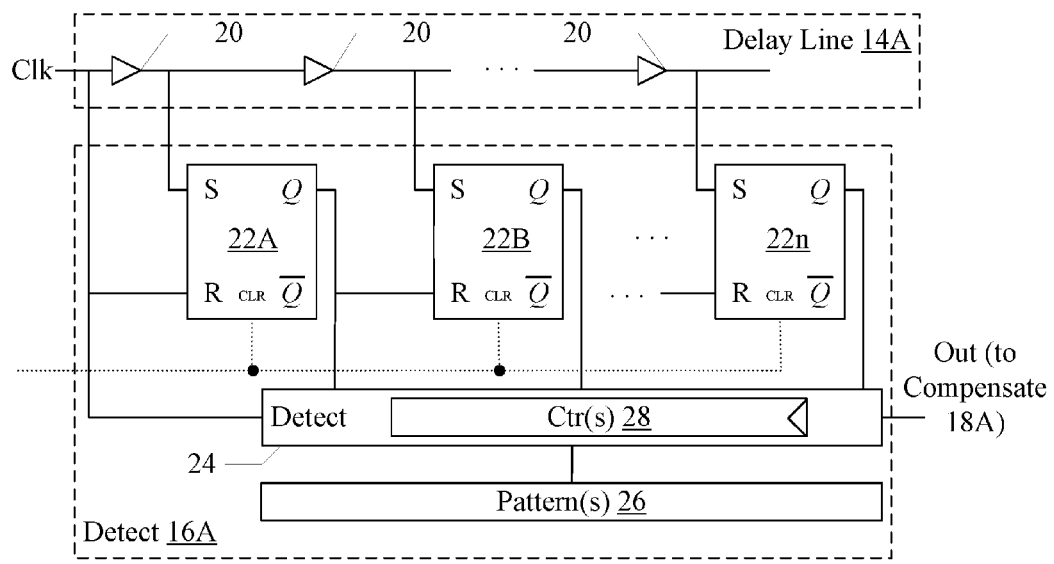
FIG. 4 is a block diagram of yet another embodiment of the envelope detector.

The D input of the flops 30A-30n may be coupled to respective taps on the delay line circuit 14A, and the clock input to the D flops 30A-30n may be the input clock Clk. In the embodiment of FIG. 4, the flops 22A-22n are used, but the coupling between the flops 22A-22n may be different. The R input of the flop 22A may be coupled to the input clock Clk, but the remaining R inputs of the flops 22B-22n may be coupled to the output of the preceding flops 22A-22n, forming a serial connection of the flops from left to right as shown in FIG. 4.

Figure 5:
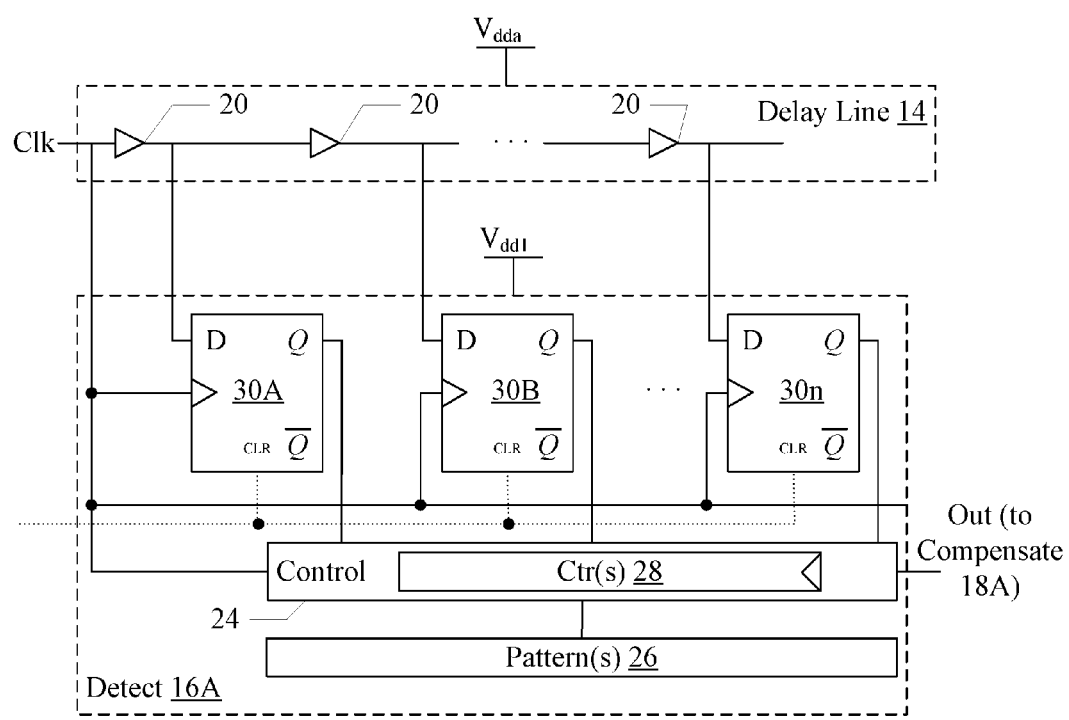
FIG. 5 is a block diagram of still another embodiment of the envelope detector.

FIG. 5 is yet another embodiment of the detect circuit 16A and a delay line circuit 14. In this case, the region in which the detect circuit 16A and the delay line circuit 14 is reversed compared to the other embodiments (i.e. the detect circuit 16A is in the load region 12B, powered by the supply voltage $V_{dd1}$, and the delay line circuit 14 is in the PLL region 12A powered by the supply voltage $V_{dda}$). In this case, operation of the flops 30A-30n may vary based on the varying supply voltage. Additionally, in some embodiments, the delay line circuit may be shared by detect circuits 16A-16C in each of the load regions 12B-12D.

The patterns 26 for the various embodiments may be different because the flops and/or the connections of the flops are different. However, in each case, the changes in the patterns due to voltage droop events may be predetermined and may be supplied as the patterns 26.

Figure 6:
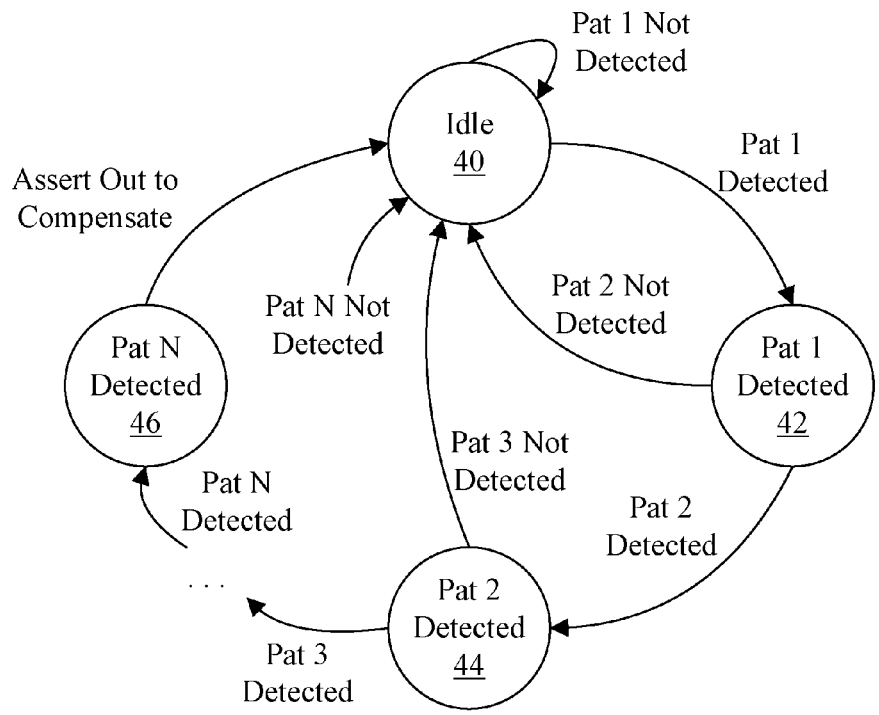
FIG. 6 is a block diagram of one embodiment of a state machine for multiple clock cycle envelope detection.

As mentioned previously, in some embodiments, a voltage droop event may be detected over multiple clock cycles of the input clock Clk. The control circuit 24 may detect an initial pattern match and then track, over consecutive clock cycles, a predetermined series of pattern matches to detect that the voltage droop event is occurring. The state machine illustrated in FIG. 6 may be one embodiment of such tracking. As illustrated in FIG. 6, the state machine may include an idle state 40 and two or more pattern detection states (e.g. states 42, 44, and 46 in FIG. 6).

That state machine may wait in the idle state 40 until the initial pattern in the series is detected (Pat 1 in FIG. 6). In response to detecting the initial pattern, the state machine may transition to Pat 1 detected state 42 and may attempt to observe the next pattern (Pat 2) in the next consecutive clock cycle. If the pattern is not detected, the state machine may return to the idle state 40. If the pattern is detected, the state machine may transition to the state 44. Similar operation may occur in each pattern detected state until the last pattern in the series is detected and transition to the Pat N detected state 46 occurs. If, at any point in the series, an expected pattern is not detected, the state machine may return to the idle state 40 and monitor for the initial pattern again.

In the Pat N detected state 46, the state machine may assert the output to the compensate circuit 18A due to the detection of the voltage droop event. The state machine may transition to the idle state 40 thereafter. In other embodiments, outputs may be asserted at one or more intermediate states such as states 42 or 44, indicating that a potential voltage droop event is in progress. Compensate circuit 18A may be configured to initiate some amount of corrective action responsive to the early signals, and fully implement corrective action when the voltage droop event is confirmed.

Figure 7:
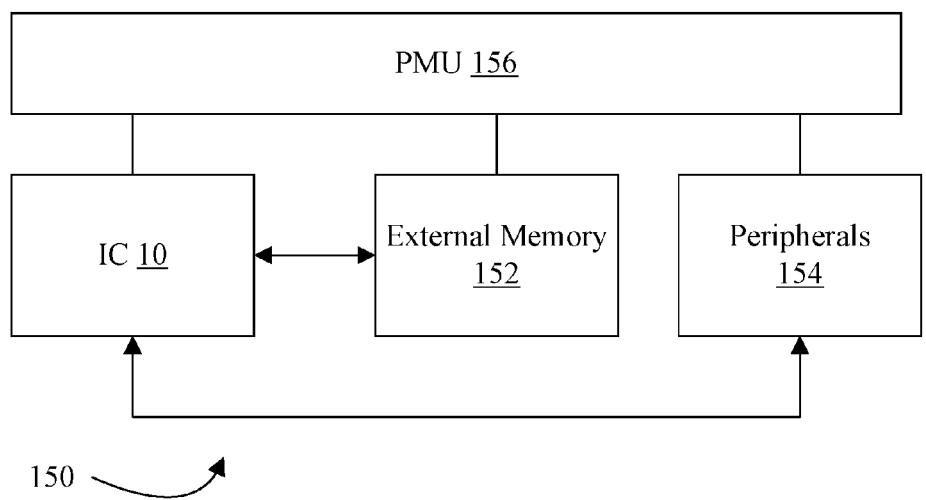
FIG. 7 is a block diagram of one embodiment of a system.

Turning now to FIG. 7, a block diagram of one embodiment of a system 150 is shown. In the illustrated embodiment, the system 150 includes at least one instance of the IC 10 coupled to one or more peripherals 154 and an external memory 152. A power management unit (PMU) 156 is provided which supplies the supply voltages to the IC 10 as well as one or more supply voltages to the memory 152 and/or the peripherals 154. In some embodiments, more than one instance of the IC 10 may be included (and more than one memory 152 may be included as well).

The PMU 156 may generally include the circuitry to generate supply voltages and to provide those supply voltages to other components of the system such as the IC 10, the memory 152, various off-chip peripheral components 154 such as display devices, image sensors, user interface devices, etc. The PMU 156 may thus include programmable voltage regulators, logic to interface to the IC 10 to receive voltage requests, etc. The PMU 156 may be configured to supply the $V_{dda}$, $V_{dd1}$, $V_{dd2}$, and $V_{dd3}$ voltages to the IC 10, for example.

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 152 may include any type of memory. For example, the external memory 152 may be SRAM, dynamic RAM (DRAM) such as synchronous DRAM (SDRAM), double data rate (DDR, DDR2, DDR3, etc.) SDRAM, RAMBUS DRAM, low power versions of the DDR DRAM (e.g. LPDDR, mDDR, etc.), etc. The external memory 152 may include one or more memory modules to which the memory devices are mounted, such as single inline memory modules (SIMMs), dual inline memory modules (DIMMs), etc. Alternatively, the external memory 152 may include one or more memory devices that are mounted on the IC 10 in a chip-on-chip or package-on-package implementation.

Numerous variations and modifications will become apparent to those skilled in the art once the above disclosure is fully appreciated. It is intended that the following claims be interpreted to embrace all such variations and modifications.

What is claimed is:
1. An integrated circuit comprising:
a delay line circuit supplied by a first power supply voltage during use, wherein an input to the delay line circuit receives a first pulse during use and wherein a plurality of taps on the delay line circuit provide delayed pulses at different times relative to the input pulse;
a plurality of flops, each flop of the plurality of flops coupled to a respective one of the plurality of taps and having an input on which a second pulse is received during use, wherein the plurality of flops are supplied by a second power supply voltage that does not depend on the first power supply voltage; and
a circuit coupled to the outputs of the plurality of flops and configured to compare a pattern of the outputs to at least one predetermined pattern that indicates a voltage droop on the second power supply voltage, and wherein the circuit is configured to output a signal indicating detection of the predetermined pattern.

2. The integrated circuit as recited in claim 1 wherein the predetermined pattern is a last pattern in a series of patterns detected over a plurality of consecutive clock cycles.

3. The integrated circuit as recited in claim 1 wherein the predetermined pattern is fused into the integrated circuit during manufacture.

4. The integrated circuit as recited in claim 1 further comprising one or more registers programmed, during use, with the predetermined pattern.

5. The integrated circuit as recited in claim 1 wherein the predetermined pattern is determined from simulation of the integrated circuit, whereby a predictable shape of the second power supply voltage magnitude indicates that the voltage droop requires corrective action in the integrated circuit.

6. The integrated circuit as recited in claim 5 further comprising a compensation circuit configured to perform the corrective action responsive to the signal from the circuit.

7. The integrated circuit as recited in claim 1 wherein the plurality of flops are set-reset (SR) flops, and wherein the S input of each SR flop is coupled to the respective one of the plurality of taps, and wherein the R input of each SR flop is coupled to the input on which the second pulse is received.

8. The integrated circuit as recited in claim 1 wherein the plurality of flops are set-reset (SR) flops, and wherein the S input of each SR flop is coupled to the respective one of the plurality of taps, and wherein the R input of a first SR flop of the plurality of flops is coupled to the input on which the second pulse is received, and wherein the R input of each other SR flop of the plurality of flops is coupled to the output of a preceding one of the SR flops in a series connection of the SR flops.

9. The integrated circuit as recited in claim 1 wherein the plurality of flops are data (D) flops, and wherein the input on which the second pulse is received is coupled to a clock input of the D flops, and wherein the data input to the D flops is coupled to the respective one of the plurality of taps.

10. The integrated circuit as recited in claim 1 wherein the pattern is detected independent of a specific magnitude of the first power supply voltage and the second power supply voltage.

11. The integrated circuit as recited in claim 1 wherein the first power supply voltage experiences more noise than the second power supply voltage during use.

12. The integrated circuit as recited in claim 11 wherein the second power supply voltage supplies an analog circuit of the integrated circuit and the first power supply voltage supplies a digital circuit of the integrated circuit.

13. The integrated circuit as recited in claim 12 wherein the analog circuit comprises a phase-locked loop (PLL).

14. A method comprising:
  sending a pulse into a delay line circuit supplied by an digital supply voltage;
  concurrently sending the pulse to a plurality of flops supplied by an analog supply voltage, wherein each of the plurality of flops is coupled to a different tap from the delay line circuit;
  comparing a pattern of outputs from the plurality of flops to a predetermined pattern that indicates a voltage droop event that requires corrective action; and
  responsive to detecting a match between the pattern of outputs and the predetermined pattern, signaling for the corrective action.

15. The method as recited in claim 14 wherein the predetermined pattern is a last pattern in a series of patterns detected over a plurality of consecutive clock cycles.

16. The method as recited in claim 14 wherein the predetermined pattern is one of a series of patterns to be detected over a plurality of consecutive clock cycles, and the method further comprises:
  detecting a mismatch between the predetermined pattern and the pattern of outputs; and
  resetting to an initial pattern of the series responsive to detecting the mismatch.

17. The method as recited in claim 14 wherein the plurality of flops are set-reset (SR) flops, and wherein the S input of each SR flop is coupled to the different tap from the delay line circuit, and wherein the R input of each SR flop receives the pulse.

18. The method as recited in claim 14 wherein the plurality of flops are set-reset (SR) flops, and wherein the S input of each SR flop is coupled to the different tap from the delay line circuit, and wherein the R input of a first SR flop of the plurality of flops receives the pulse, and wherein the R input of each other SR flop of the plurality of flops is coupled to the output of a preceding one of the SR flops in a series connection of the SR flops.

19. The method as recited in claim 14 wherein the plurality of flops are data (D) flops, and wherein the second pulse is received on a clock input of the D flops, and wherein the data input to the D flops is coupled to the different tap from the delay line circuit.

20. An integrated comprising:
  a delay line circuit supplied by an analog power supply voltage during use, wherein an input to the delay line circuit receives a first pulse during use and wherein a plurality of taps on the delay line circuit provide delayed pulses at different times relative to the input pulse;
  a plurality of flops, each flop of the plurality of flops coupled to a respective one of the plurality of taps and having an input on which a second pulse is received during use, wherein the plurality of flops are supplied by a digital power supply voltage; and
  a circuit coupled to the outputs of the plurality of flops and configured to compare a pattern of the outputs to at least one predetermined pattern that indicates a voltage droop on the digital power supply voltage, and wherein the circuit is configured to output a signal indicating detection of the predetermined pattern.

* * * * *